United States Patent
Chen et al.

(10) Patent No.: US 7,420,277 B2
(45) Date of Patent: Sep. 2, 2008

(54) SYSTEM FOR HEAT DISSIPATION IN SEMICONDUCTOR DEVICES

(75) Inventors: Hsien-Wei Chen, Xinying (TW); Jiun-Lin Yeh, Taipei (TW); Shin-Puu Jeng, Hsinchu (TW); Yi-Lung Cheng, Danshuei Township, Taipei County (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 226 days.

(21) Appl. No.: 10/801,475

(22) Filed: Mar. 16, 2004

(65) Prior Publication Data

US 2005/0205991 A1    Sep. 22, 2005

(51) Int. Cl.
*H01L 23/48* (2006.01)
*H01L 23/52* (2006.01)
*H01L 29/40* (2006.01)

(52) U.S. Cl. .................................. 257/758; 257/765
(58) Field of Classification Search ................ 257/758, 257/774, 765
See application file for complete search history.

(56) References Cited

U.S. PATENT DOCUMENTS

| 5,905,289 A | 5/1999 | Lee | |
|---|---|---|---|
| 6,225,697 B1 * | 5/2001 | Iguchi | 257/758 |
| 2004/0195670 A1 * | 10/2004 | Landis | 257/700 |
| 2005/0035457 A1 * | 2/2005 | Tomita et al. | 257/758 |

OTHER PUBLICATIONS

Peter Van Zant, Microchip Fabrication, 2000, McGraw-Hill, pp. 398-401.*

* cited by examiner

*Primary Examiner*—Monica Lewis
(74) *Attorney, Agent, or Firm*—Haynes Boone, LLP

(57) ABSTRACT

The present disclosure provides a method and system for heat dissipation in semiconductor devices. In one example, an integrated circuit semiconductor device includes a semiconductor substrate; one or more metallurgy layers connected to the semiconductor substrate, and each of the one or more metallurgy layers includes: one or more conductive lines; and one or more dummy structures between the one or more conductive lines and at least two of the one or more dummy structures are connected; and one or more dielectric layers between the one or more metallurgy layers.

10 Claims, 8 Drawing Sheets

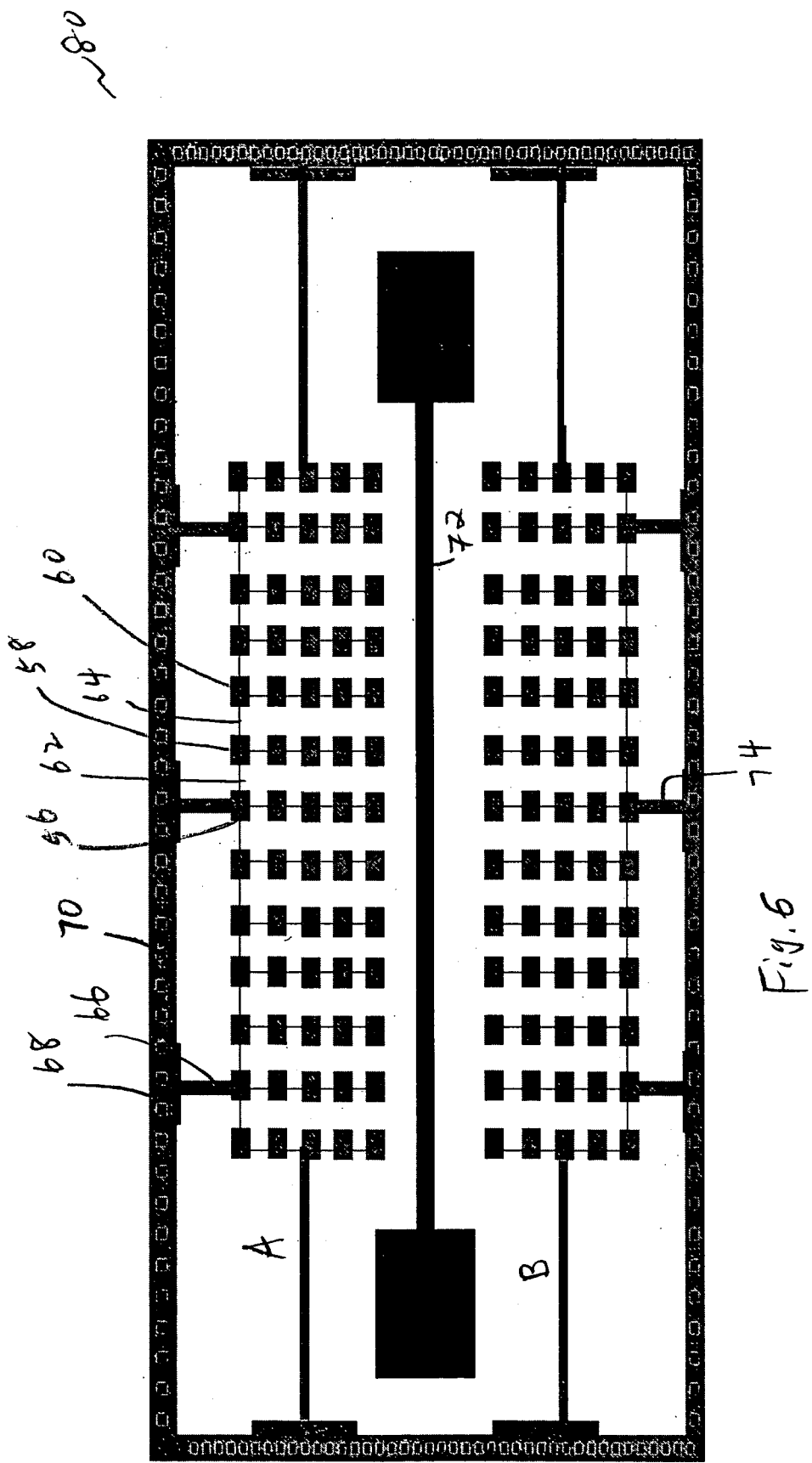

SYSTEM FOR HEAT DISSIPATION IN SEMICONDUCTOR DEVICES

BACKGROUND

This disclosure relates to the design and fabrication of semiconductor devices, and more specifically, to a system and method of heat dissipation for semiconductor devices.

Heat generation from electronic devices is well known. For example, a typical microprocessor typically consumes approximately 40 watts of electricity, a majority of which will eventually be transformed into heat. However, if the heat is not well dissipated, the performance of electronic devices may be degraded—poor heat dissipation may cause damages to electronic devices, and reduce the reliability and life expectancy of the devices.

Generally, heat produced in a semiconductor device is dissipated by device conduction. Typically, heat simply emits through materials utilized to form the basic wiring structure of the semiconductor device. Frequently, no special structures are provided to help dissipate heat within the semiconductor device.

Prompted by the advancement of integrated circuit materials and design, new generations of semiconductor devices possess smaller and more complex circuits, thereby enhancing the need for heat dissipation. In addition, low-k materials have been introduced to replace the conventional SiO2 material to address RC delay issues. However, most of the low-k materials possess poor thermal conductivity.

Accordingly, it is desired to provide an improved system and method for dissipating heat in semiconductor devices.

BRIEF DESCRIPTION OF THE DRAWINGS

FIG. 6 illustrates a top view of a metallurgy layer that includes dummy structures that are connected to vias according to one embodiment of the present disclosure.

DETAILED DESCRIPTION

Figure 1:
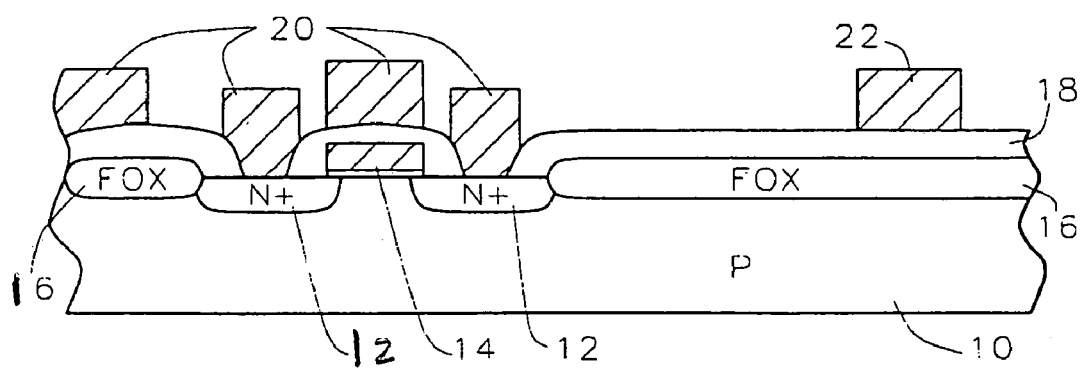
FIG. 1 illustrates a cross-sectional view of a semiconductor substrate with a first level metallurgy according to one embodiment of the present disclosure.

This disclosure relates to semiconductor devices and the design and fabrication thereof, and more specifically, to a system and method of heat dissipation for semiconductor devices.

For the purposes of promoting an understanding of the principles of the disclosure, references will now be made to the embodiments, or examples, illustrated in the drawings and specific languages will be used to describe the same. It will nevertheless be understood that no limitation of the scope of the disclosure is thereby intended. Any alterations and further modifications in the described embodiments, and any further applications of the principles of the disclosure as described herein are contemplated as would normally occur to one skilled in the art to which the disclosure relates.

Referring now to FIG. 1, shown therein is a cross-sectional view of a partial semiconductor device according to one embodiment of the present disclosure. In this embodiment, a substrate 10 may comprise a field effect transistor, which includes source and drain regions 12 and a gate 14. The substrate 10 may also comprise a field oxide layer 16, and a relatively thick borophosphosilicate glass (BPSG) layer 18. Alternate embodiments may include a shallow trench isolation or a split gate. While the drawings show the N+ source and drain regions 12, it is understood by those skilled in the art that the conductivity types may be different. In this example, a first metallurgy level may reside on the surface of the substrate 10, and may comprise metal lines 20 (one or more operative conductive lines that are closely spaced), and a more distantly spaced operative conductive metal line 22. To properly construct the conductive lines 20 and 22, design rules are utilized for the particular application to specify the necessary widths of the conductive lines and the distances between them. In one example, the width of a conductive line may be approximately equal to the distance between the conductive lines. Also, the feature size, which may be defined by a number of factors, such as the wavelength of the light used to expose the pattern, the type of resist, and other factors that are known in the art, may restrict the minimum dimensions of the conductive lines.

Figure 2:
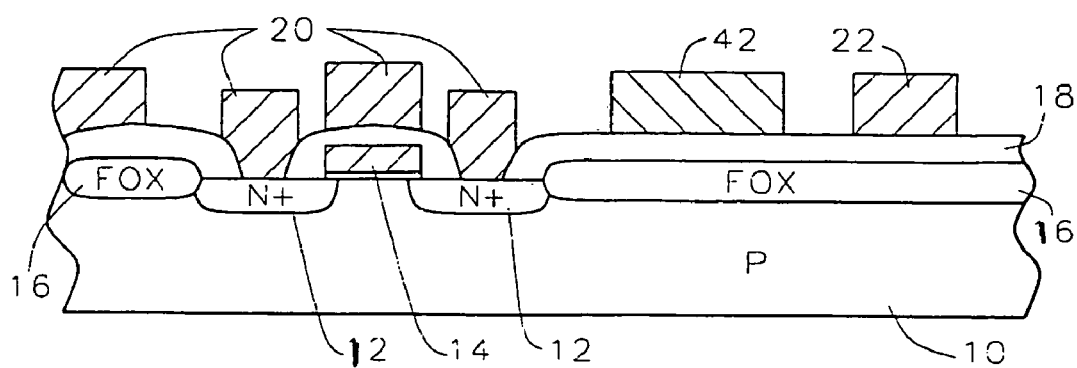
FIG. 2 illustrates a cross-sectional view of a semiconductor substrate with a first level metallurgy that includes a dummy structure according to one embodiment of the present disclosure.

Referring now to FIG. 2, shown therein is another partial semiconductor device that includes a dummy structure 42 that may help dissipate heat according to one embodiment of the present disclosure. In this embodiment, the conductive line pattern (e.g., lines 20, 22) may be examined to locate vacant areas for positioning dummy structures. In one example, when the distance between conductive lines equals to or exceeds three times the width of the conductive line, a dummy structure may be positioned in the vacant space. However, dummy structures may also be placed when the distance between the conductive lines is smaller. The placement of dummy structures may take into consideration the possible capacitance that may be generated between the conductive lines and the dummy structures. To prevent the generation of significant capacitance, it may be advisable to maintain a distance of at least 0.1 micrometer between a dummy structure and a conductive line. However, it is contemplated that a shorter distance is also possible, as long as the dummy structure is separate from the conductive line. It is contemplated that the sizes of the dummy structures may be flexible.

Figure 3:
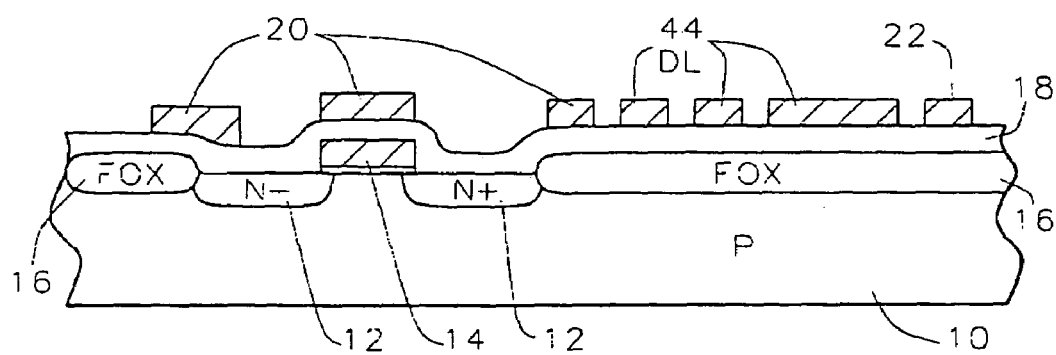
FIG. 3 illustrates another cross-sectional view of a semiconductor substrate with a first level metallurgy that includes dummy structures according to one embodiment of the present disclosure.

Referring now to FIG. 3, shown therein is another partial semiconductor device that includes a plurality of dummy structures 44 that help to dissipate heat according to one embodiment of the present disclosure. In this embodiment, a plurality of dummy structures may be placed when the distance between the conductive lines is smaller than five times the widths of the conductive lines, or if the width of the dummy structure is smaller than three times the widths of the conductive lines. However, a plurality of dummy structures are also contemplated under other distances and widths. In addition, the distances between and among the dummy structures may be varied over a wide variety of ranges. Therefore, a variety of flexibility is anticipated in positioning the dummy structures.

In furtherance of the example, each of the structures 44 may comprise a rectangular prism, polygon, partial rectangular prism, cube, partial cube, sphere, partial sphere, pyramid, partial pyramid, cone, partial cone or other regular or irregular shapes. It is contemplated that each of the structures 44 may comprise copper, aluminum, other type of metals, or other materials suitable for heat dissipation. It is also contemplated that all of the structures 44 may comprise the same type of metal. Alternatively, at least two of the structures 44 may comprise different types of metals. Further, it is contemplated that each of the structures 44 may comprise a variety of sizes. In one example, the structures 44 may comprise a height similar to those of the conductive lines. However, other heights of the structures 44 are also contemplated.

Figure 4:
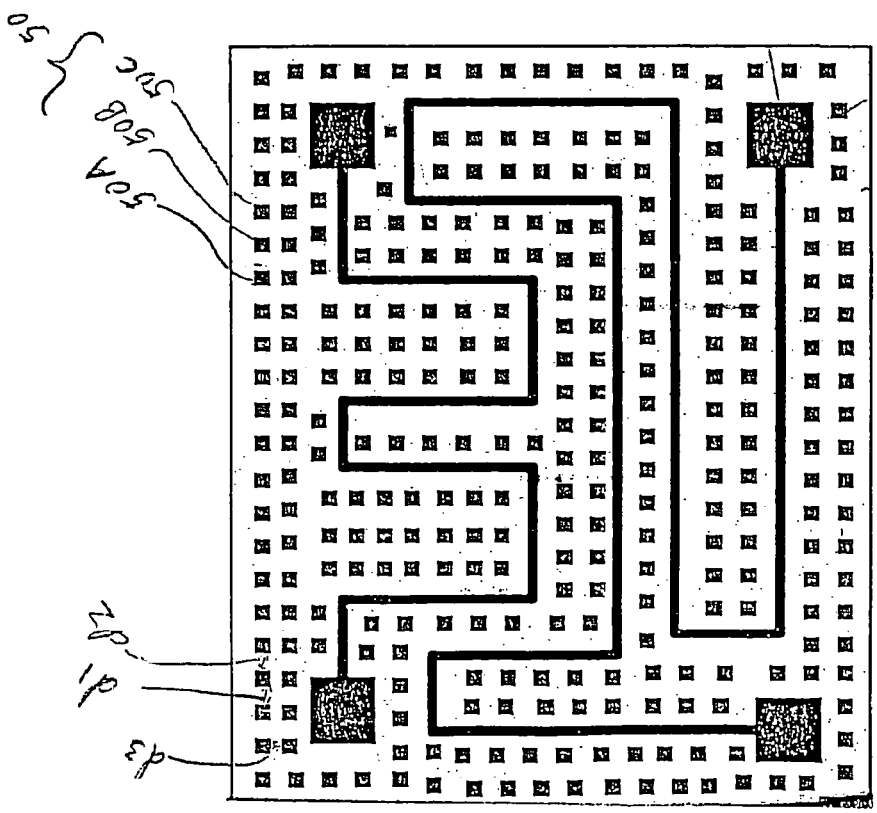
FIG. 4 illustrates a top view of a semiconductor metallurgy layer that includes dummy structures according to one embodiment of the present disclosure.

Referring now to FIG. 4, shown therein is a top view of a metallurgy layer that includes a plurality of dummy structures 50 for heat dissipation according to one embodiment of the present disclosure. In this embodiment, the widths of the dummy structures may be less then one micrometer to prevent possible hillock growth, which could cause potential shorting between metallurgy levels. In addition, widths of the plurality of dummy structures 50 may be similar to produce a more smooth etching or patterning of the conductive lines and the dummy structures. However, it is also contemplated that the widths of the dummy structures 50 may be at least one micrometer, and that the widths of the plurality of dummy structures 50 may differ. In one example, the distance d1 between two dummy structures is equal to the distance d2 between another two dummy structures. Similarly, d3 may be equal to d1. However, it is also contemplated that distances between dummy structures may differ.

Figure 5:
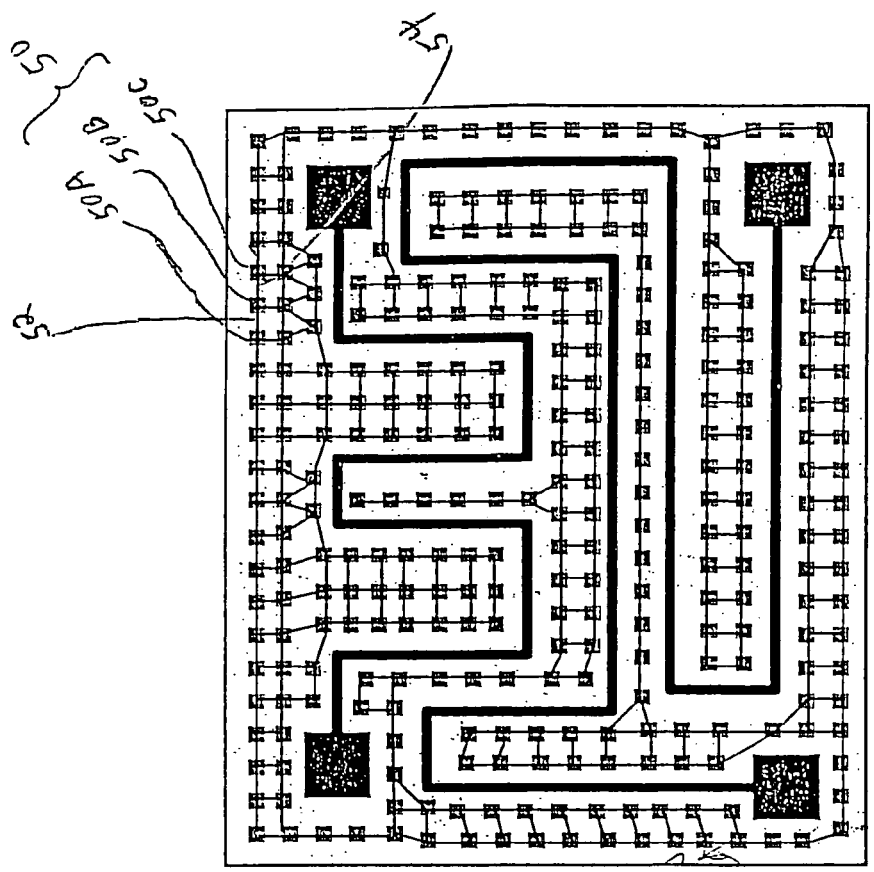
FIG. 5 illustrates a top view of a metallurgy layer that includes connected dummy structures according to one embodiment of the present disclosure.

Referring now to FIG. 5, shown therein is another top view of a metallurgy layer that includes a plurality of dummy structures 50 according to one embodiment of the present disclosure. In this embodiment, dummy structures 50A and 50B are connected by a line 52, and dummy structures 50B and 50C are connected by a line 54. Likewise, other dummy structures are also connected by various lines. It is contemplated that each of the lines 52 and 54 may comprise copper, aluminum, other types of metals, or other materials suitable for heat dissipation. It is also contemplated that the line 52 and the dummy structure 50B may comprise the same type of material, or that they may comprise different materials.

In furtherance of this example, the width of the line 52 or 54 may be smaller than that of the dummy structure 50A. However, it is also contemplated that the width of the line 52 or 54 may be equal to or larger than that of the dummy structure 50A. Further, each of the lines 52 and 54 may comprise a rectangular prism, polygon, partial rectangular prism, cube, partial cube, sphere, partial sphere, pyramid, partial pyramid, cone, partial cone or other regular or irregular shapes.

Referring now to FIG. 6, shown therein is another top view of a simplified metallurgy layer 80 of a semiconductor device according to one embodiment of the present disclosure. In this embodiment, dummy structures 56,58 and 60 are thermally connected together by lines 62 and 64. In fact, all the dummy structures located on side A of a conductive line 72 have been connected together. Likewise, all the dummy structures located on side B of a conductive line 72 have been connected together. Here, one or more lines 66 are utilized to thermally connect dummy structures on side A of the conductive line 72 to a seal ring 68. Likewise, one or more lines 74 are utilized to thermally connect dummy structures on side B of the conductive line 72 to the seal ring 68. Through one or more vias 70, the seal ring 6B of the metallurgy layer 80 may be thermally connected to the seal rings of other metallurgy layers. Accordingly, dummy structures on the metallurgy layer 80 may be thermally connected to dummy structures on other metallurgy layers. It is contemplated that not all dummy structures on side A or B of the conductive line 72 may be connected. As a result, not all dummy structures on the metallurgy layer 80 may be connected to dummy structures on other metallurgy layers. Further, each of the lines 66 and 74 may comprise a variety of shapes, materials and sizes. For example, each of them may comprise a rectangular prism, polygon, partial rectangular prism, cube, partial cube, sphere, partial sphere, pyramid, partial pyramid, cone, partial cone or other regular or irregular shapes. It is contemplated that each of the lines 66 and 74 may comprise copper, aluminum, other type of metals, or other materials suitable for heat dissipation, Further, the widths of the lines 66 and 74 may be larger than one micrometer. Alternatively, the widths of the lines 66 and 74 may be no more than one micrometer. Finally, each of the lines 66 and 74 may be identical or different.

Figure 7A:
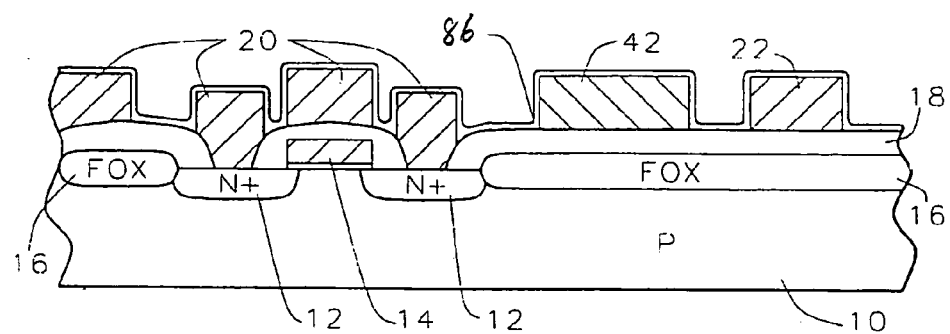
FIG. 7A-7D illustrates cross-sectional views of a partial semiconductor device according to one embodiment of the present disclosure.

Referring now to FIG. 7A, shown therein is a cross-sectional view of a partial semiconductor device according to one embodiment of the present disclosure. In this embodiment, a dielectric layer 86 may be formed over lines 20, 22, and 42 to level topology. In one example, the layer 86 may be formed by plasma enhanced oxidation (PE-OX), with a thickness in the range of about 400 to 3000 Angstroms. The layer 86 may be deposited by plasma enhanced chemical vacuum deposition. It is contemplated that the layer 86 may comprise other thickness parameters and deposition methods.

Figure 7B:
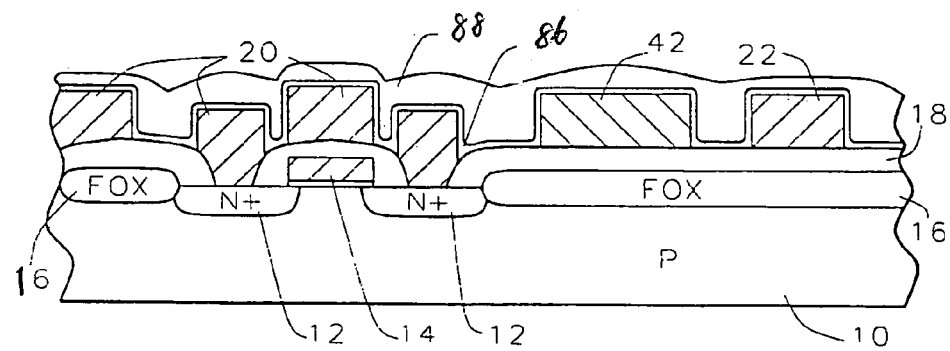

Referring now to FIG. 7B, shown therein is another cross-sectional view of a partial semiconductor device according to one embodiment of the present disclosure. In this embodiment, a dielectric layer 88 may be deposited by spin-on-glass techniques (SOG) and cured. The layer 88 may be used to fill in the gaps between the lines and, therefore, presents a relatively planar surface. The layer 88 may be deposited by spin-on-glass techniques, baked at between about 150 to 260 centigrade degrees for a few minutes to remove the solvents from the layer, and cured at between about 400 to 450 centigrade degrees for 30 to 60 minutes to form the silicon oxide insulating layer.

Figure 7C:
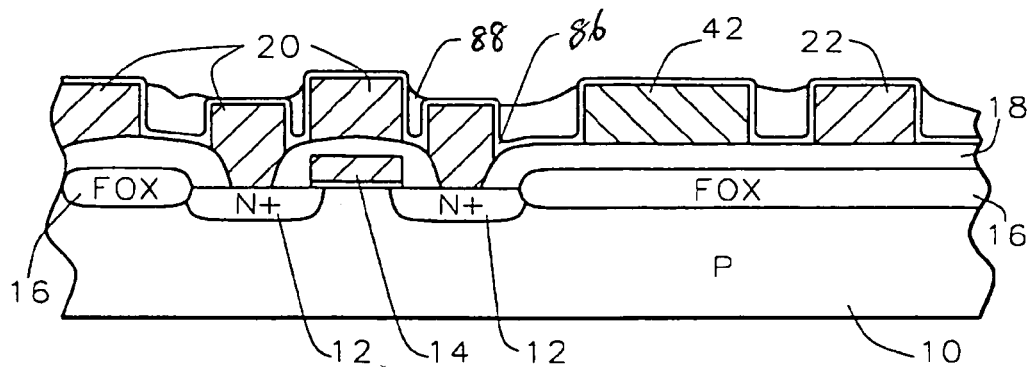

Referring now to FIG. 7C, shown therein is another cross-sectional view of a partial semiconductor device according to one embodiment of the present disclosure. In this embodiment, the top surface of the dielectric layer 86 and 88 may be etched back after spin-on-glass curing to further enhance the surface planarity. The procedure may be achieved by anisotropic reactive ion etching processes.

Figure 7D:
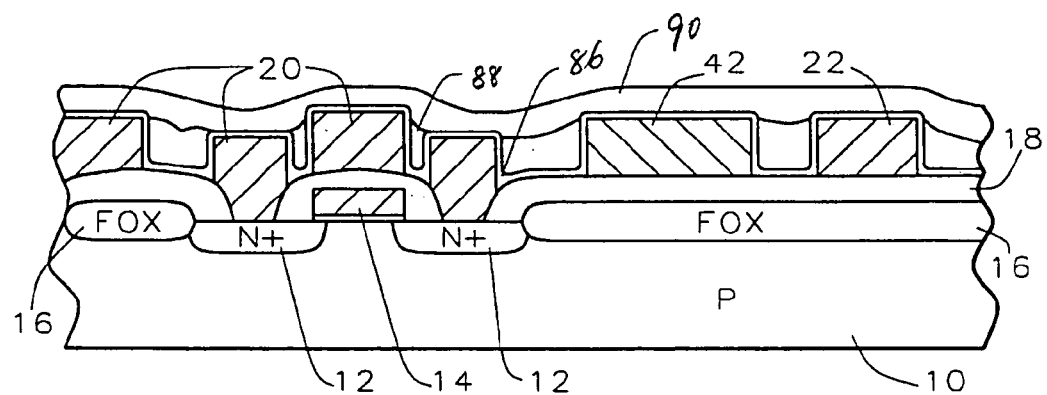
Figure 7E:
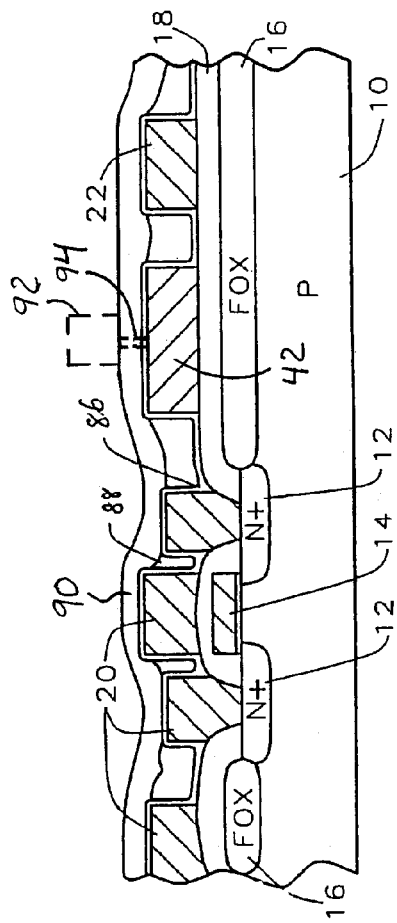
FIG. 7E illustrates a cross-sectional view of the partial semiconductor device of FIG. 7D, with the addition of a dummy structure and a via.
Figure 7F:
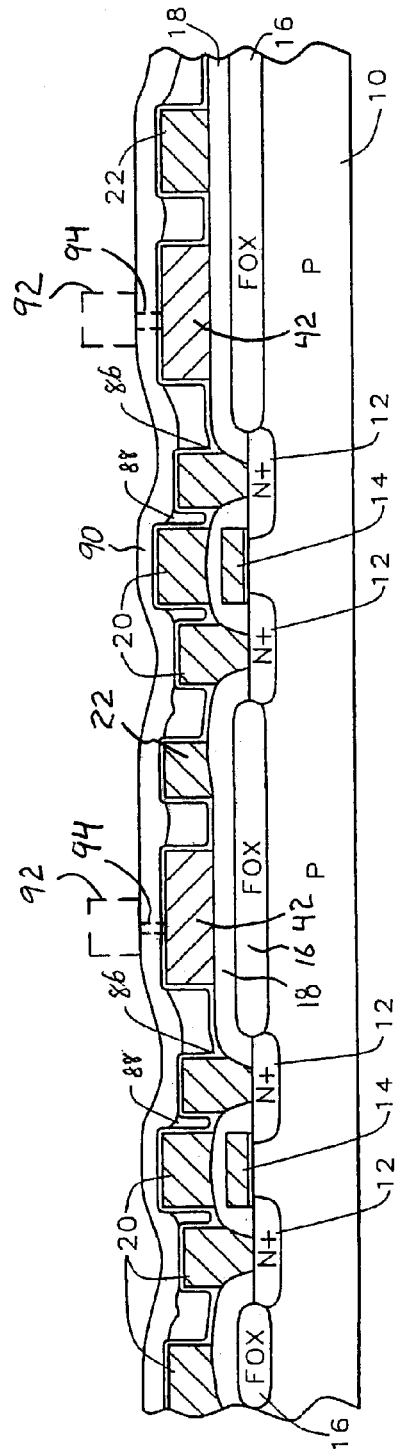
FIG. 7F illustrates a cross-sectional view of a partial semiconductor device according to an embodiment of the present disclosure.

Referring now to FIG. 7D, shown therein is another cross-sectional view of a partial semiconductor device according to one embodiment of the present disclosure. In this embodiment, a top dielectric layer 90 may be deposited by plasma enhanced chemical vapor deposition (PE-CVD) techniques. The layer 90 may have a thickness of approximately 2000 to 8000 Angstroms. Vias may then be formed in the dielectric layers 86 and 88, and another metallurgy level and dielectric layer may be formed according to procedures known in the art. More specifically, FIG. 7E is a cross-sectional view that is the same as FIG. 7D, except that a dummy structure 92 of another metallurgy level is shown diagrammatically in broken lines on the dielectric layer 90, and a via is shown diagrammatically in broken lines at 94, the via extending between and thermally coupling the dummy structures 42 and 92. In addition, FIG. 7F is a cross-sectional view of a partial semiconductor device according to an embodiment of the present disclosure, the left and right halves of FIG. 7F each being effectively identical to FIG. 7E. Thus, FIG.7F shows two dummy structures 42 in one metallurgy level and two dummy structures 92 in a different metallurgy level, each dummy structure 42 being thermally coupled to a respective one of the dummy structures 92 by a respective via 94.

Many variations of the above disclosure are also contemplated by the present disclosure. In one example, instead of constructing a plurality of dummy structures on a metallurgy layer and connecting them, one large metal structure may be utilized. In another example, dummy structures from one metallurgy layer may be selectively connected to one or more other metallurgy layers. In a third example, some dummy structures on a given metallurgy layer may not be connected. In a fourth example, some dummy structures on a given metallurgy layer may not be connected with dummy structure(s) of other metallurgy layers. In addition, dummy structures are also described in the U.S. Pat. No. 5,905,289 entitled "Process for Producing a Semiconductor Device with a Planar Top Surface" to Lee, which is hereby incorporated by reference in its entirety.

Although only a few exemplary embodiments of this disclosure have been described in detail above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. An integrated circuit semiconductor device, comprising:
   a semiconductor substrate;
   one or more metallurgy layers connected to the semiconductor substrate, wherein each of the one or more metallurgy layers comprises one or more conductive lines and one or more dummy structures between the one or more conductive lines wherein at least two of the one or more dummy structures from different metallurgy layers are thermally connected; and
   one or more dielectric layers between the one or more metallurgy layers;
   wherein there are at least two of the dummy structures that are connected by a first line;
   wherein the width of the first line is less than the width of each of the two dummy structures;
   wherein the first line comprises aluminum;
   wherein there are another two of the dummy structures that are connected by a second line; and
   wherein the first line and the second line comprise different materials.

2. The semiconductor device of claim 1 wherein there are at least two of the metallurgy layers that each include at least two of the dummy structures, and wherein at least two of the dummy structures on a first of the metallurgy layers are connected to at least two of the dummy structures on a second of the metallurgy layers through a plurality of vias.

3. The semiconductor device of claim 1 wherein at least one of the one or more dummy structures comprises copper.

4. The semiconductor device of claim 1 wherein at least one of the one or more dummy structures comprises aluminum.

5. The semiconductor device of claim 1 wherein the distance between one of the dummy structures and one of the one or more conductive lines is at least 0.1 µm.

6. The semiconductor device of claim 1 wherein there are at least two of the dummy structures that comprise different shapes.

7. The semiconductor device of claim 1 wherein there are at least two of the dummy structures that comprise different materials.

8. The semiconductor device of claim 1 wherein there are at least two of the dummy structures that comprise different sizes.

9. The semiconductor device of claim 1 wherein the distance between each of the dummy metal structures and each of the conductive lines is at least 0.1 µm; and wherein the one or more dummy metal structures on a first metallurgy layer are connected to the one or more dummy metal structure on a second metallurgy layer through vias.

10. The semiconductor device of claim 9 wherein the respective heights of the metal lines and the dummy metal structures are similar.

* * * * *